(12) United States Patent
Lancel et al.

(10) Patent No.: US 12,123,913 B2
(45) Date of Patent: Oct. 22, 2024

(54) DIAGNOSIS OF ENERGY STORAGE SYSTEMS DURING OPERATION

(71) Applicant: ELECTRICITE DE FRANCE, Paris (FR)

(72) Inventors: Gilles Lancel, Cachan (FR); Emeric Brun, Avon (FR)

(73) Assignee: ELECTRICITE DE FRANCE, Paris (FR)

( * ) Notice: Subject to any disclaimer, the term of this patent is extended or adjusted under 35 U.S.C. 154(b) by 182 days.

(21) Appl. No.: 17/117,936

(22) Filed: Dec. 10, 2020

(65) Prior Publication Data

US 2021/0181257 A1 Jun. 17, 2021

(30) Foreign Application Priority Data

Dec. 11, 2019 (FR) ...................................... 19 14139

(51) Int. Cl.
*G01R 31/36* (2020.01)
*G01R 31/3828* (2019.01)
(Continued)

(52) U.S. Cl.
CPC ..... *G01R 31/3648* (2013.01); *G01R 31/3828* (2019.01); *G01R 31/392* (2019.01); *G01R 31/54* (2020.01)

(58) Field of Classification Search
None
See application file for complete search history.

(56) References Cited

U.S. PATENT DOCUMENTS 6,285,163 B1 * 9/2001 Watanabe ............ G01R 31/389
324/426
8,280,652 B2 * 10/2012 Syracuse .............. G01R 15/142
702/57

(Continued)

OTHER PUBLICATIONS

Weng et al., "A unified open-circuit-voltage model of lithium-ion batteries for state-of-charge estimation and state-of-health monitoring", Feb. 19, 2014, Journal of Power Sources 258, pp. 228-237 (Year: 2014).*

(Continued)

*Primary Examiner* — Brent A. Fairbanks
(74) *Attorney, Agent, or Firm* — NIXON & VANDERHYE (57) ABSTRACT

A method for determining an open circuit voltage of an electrochemical device, including: a. collecting measurement data of the device, the measurements i. including at least the current $I_t$ and the voltage $U_t$ at the terminals of the device, ii. being time-stamped, and iii. being acquired during an uninterrupted and operational functional period of the device; b. calculating, for a plurality of times t, iv. a corrected intensity by applying a correction function to the measured intensity $I_t$, and v. an instantaneous charge based on a time series of the corrected intensity so as to obtain, for each time t, a set of collected and calculated data; c. grouping the data sets into ranges of instantaneous charge values based on the charge value of each set; and d. separately for each group, calculating an open circuit voltage of the device.

19 Claims, 6 Drawing Sheets

(3 of 6 Drawing Sheet(s) Filed in Color)

(51) Int. Cl.
   *G01R 31/392*   (2019.01)
   *G01R 31/54*    (2020.01)

(56) References Cited

U.S. PATENT DOCUMENTS

| | | | | |
|---|---|---|---|---|
| 2005/0269991 | A1* | 12/2005 | Mitsui | G01R 31/3842 |
| | | | | 320/132 |
| 2006/0186890 | A1* | 8/2006 | Iwane | G01R 31/392 |
| | | | | 324/426 |
| 2009/0087725 | A1* | 4/2009 | Sim | G01R 1/44 |
| | | | | 324/105 |
| 2010/0036626 | A1* | 2/2010 | Kang | G01R 31/3648 |
| | | | | 702/63 |
| 2012/0283970 | A1* | 11/2012 | Boehm | G01R 31/3828 |
| | | | | 702/64 |
| 2013/0179061 | A1* | 7/2013 | Gadh | B60L 53/30 |
| | | | | 701/1 |
| 2013/0311118 | A1 | 11/2013 | Sejima | |
| 2015/0293183 | A1 | 10/2015 | Tenmyo et al. | |
| 2016/0054390 | A1* | 2/2016 | Lin | B60L 58/10 |
| | | | | 702/63 |
| 2018/0050681 | A1 | 2/2018 | Ohkawa et al. | |
| 2019/0004115 | A1 | 1/2019 | Nakamura et al. | |
| 2019/0036356 | A1* | 1/2019 | Subbaraman | G01R 31/392 |
| 2019/0235011 | A1* | 8/2019 | Pinney | G01W 1/00 |
| 2020/0233037 | A1* | 7/2020 | Yamamoto | G01R 31/392 |
| 2022/0097566 | A1* | 3/2022 | Tanaka | H02J 7/02 |

OTHER PUBLICATIONS

Search Report for FR1917139, dated Aug. 28, 2020, 6 pages.

\* cited by examiner

DIAGNOSIS OF ENERGY STORAGE SYSTEMS DURING OPERATION

BACKGROUND OF THE INVENTION

Field of the Invention

The invention relates to the field of electrochemical devices for storing energy, and more particularly to the diagnosis of batteries, or accumulators.

Description of the Related Art

It is known to model the performance losses of batteries overtime, according to their use. This involves monitoring the various usage parameters and in all cases remains theoretical: the actual state of the battery at any given time remains unknown.

It is also possible to measure certain properties of a battery to deduce its state. One of the performance parameters of an electrochemical device is a variable called "state of health", or SOH. This parameter, unitless and generally expressed as a percentage, is defined as the ratio of the actual electrical capacity $C_{rea}$ of the tested element to the nominal electrical capacity $C_{nom}$ of the same element. The following equation represents this parameter:

$$SOH = \frac{C_{rea}}{C_{nom}} \times 100 \quad \text{[Math. 1]}$$

Another useful parameter for qualifying the state of an electrochemical device is "state of charge", or SOC. This parameter is also unitless and generally expressed as a percentage. SOC is defined as the ratio of the actual available charge $Q_t$ of the tested element to the maximum charge $Q_{max,t}$ of the same element in its current state of health. The following equation represents this parameter:

$$SOC = \frac{Q_t}{Q_{max,t}} \times 100 \quad \text{[Math. 2]}$$

It is possible to measure properties of an electrochemical element relating to its state of health. Generally, this requires imposing specific stresses on it (characterization cycles). This requires special control equipment and time. Known methods even tend to degrade the tested elements and their state of health to be evaluated. In general, an electrochemical element subjected to such tests is no longer operational during the tests. In other words, this is carried out during a maintenance period.

Finally, some methods can be implemented during an operational phase of the device but only under certain operating conditions, for example when the charge and/or discharge is complete. Others involve operators entering data other than measurement data of the device.

The following documents concern such subjects: WO 2019/025171, WO 2015/133103, WO 2013/111231, WO 2015/186283, FR 3003038, WO 2011/1555184.

SUMMARY OF THE INVENTION

The present disclosure improves the situation.

A method is proposed for determining an open circuit voltage of an electrochemical device, implemented by computer means, comprising:

a. collecting measurement data of the device, said measurements
  i. including at least the current $I_t$ and the voltage $U_t$ at the terminals of the device,
  ii. being time-stamped, and
  iii. being acquired during an uninterrupted and operational functional period of the device;
b. calculating, for a plurality of times t,
  iv. a corrected current intensity $I_{cor,t}$ by applying a correction function to the measured current intensity $I_t$, and
  v. an instantaneous charge $Q_t$ based on a time series of the corrected current intensity $I_{cor}$ so as to obtain, for each time t, a set of collected and calculated data $I_t$, $U_t$, $I_{cor,t}$, $Q_t$;

c. grouping the data sets into ranges of instantaneous charge values based on said charge value of each set;
d. separately for each group, calculating an open circuit voltage of the device.

According to another aspect, a computer program is provided comprising instructions for implementing all or part of a method as defined herein when this program is executed by a processor. According to another aspect, a non-transitory, computer-readable storage medium is provided on which such a program is stored.

The features set forth in the following paragraphs may optionally be implemented. They may be implemented independently of each other or in combination with each other:

The method further comprises, after calculating the open circuit voltages:

e. calculating a state of health of the device according to the following formula:

$$SOH = \frac{Q_{1 \to 2, agé}}{Q_{1 \to 2, init}} \quad \text{[Math. 7]}$$

where $Q_{1 \to 2, age}$ corresponds to the charge difference Q between two data sets corresponding to two open circuit voltages $COV_1$ and $COV_2$ and where $Q_{1 \to 2, init}$ corresponds to the charge difference Q between the two data sets corresponding to the two open circuit voltages $COV_1$ and $COV_2$ in an initial state of the device for which the state of health is considered to be maximal.

The method further comprises, after calculating the open circuit voltages:

f. subjecting the calculated open circuit voltages to an incremental capacity analysis (ICA) so as to obtain a curve of characteristic patterns,
g. comparing the obtained curve to reference curves corresponding to various states of health in order to identify the corresponding state of health.

In the method, the calculation step is carried out iteratively at each time t and the calculation of the instantaneous charge $Q_t$ based on a time series of the corrected current intensity $I_{cor}$ is implemented according to the following formula, where $Q(t=t0)$ is a charge level relative to the initial charge level:

$$Q(t) = Q(t = t_0) + \int_{t_0}^{t} I_{corr}(\tau)d\tau \qquad \text{[Math. 3]}$$

In the method, the calculation step further comprises:
vi. calculating a state of charge (SOC) according to the following formula:

$$SOC_i = SOC_{i-1} + \frac{\int_{i-1}^{i} \alpha(I_i)dt}{Q_{max,i}} = SOC_{i-1} + \frac{\int_{i-1}^{i} I_{corr}dt}{Q_{max,i}} \qquad \text{[Math. 8]}$$

where the index i represents the iteration and a the correction function.

The method further comprises, after calculating the open circuit voltages:
h. comparing the calculated open circuit voltages to curves of correspondence between open circuit voltages and state of charge in order to identify the corresponding state of charge.

The method further comprises, after calculating the open circuit voltages, calculating the state of health of the device by at least one of the following operations:
comparing the obtained open circuit voltages to the open circuit voltages obtained by a plurality of laboratory aging tests on said device;
comparing the obtained open circuit voltages to the open circuit voltages obtained by a plurality of laboratory aging tests on a device of a model similar to said device;
comparing the obtained open circuit voltages to the open circuit voltages obtained by a previous implementation of the method according to claim 1 on said device.

Similar model is understood here to mean an electrochemical device having the same materials as the analyzed device, in particular for the electrodes.

BRIEF DESCRIPTION OF DRAWINGS

The patent or application file contains at least one drawing executed in color. Copies of this patent or patent application publication with color drawings will be provided by the Office upon request and payment of the necessary fee.

Other features, details and advantages will be apparent from reading the following detailed description and from analyzing the accompanying drawings, in which.

DESCRIPTION OF THE PREFERRED EMBODIMENTS

For the most part, the drawings and description below contain elements that are certain in nature. Therefore not only can they serve to provide a better understanding of this disclosure, they also contribute to its definition where appropriate.

Figure 1:
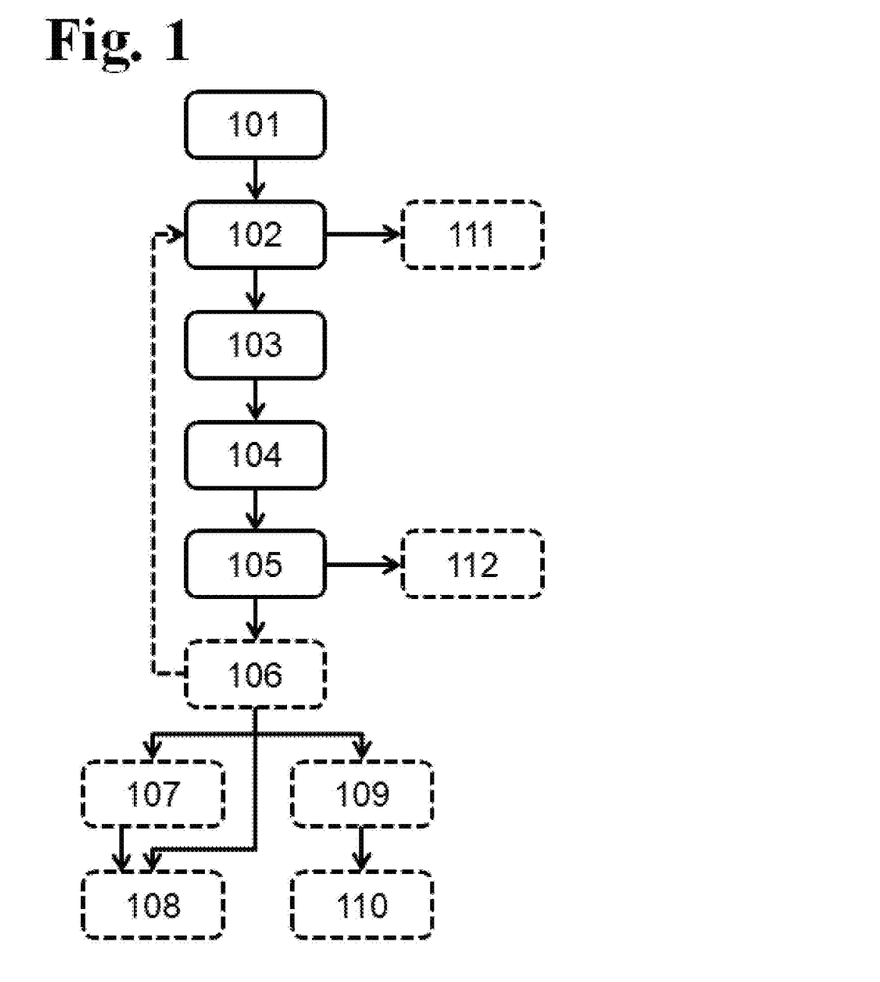
FIG. 1 shows a diagram of one embodiment of a method.

One embodiment of a method for determining an open circuit voltage of an electrochemical device will now be described with reference to [FIG. 1], and initially in the form of a first set of operations 101 to 106. Electrochemical device is understood here to mean any device capable of storing electrical energy in chemical form, typically batteries or accumulators.

In a first operation 101, measurement data of the device is collected. The measurements include at least the current $I_t$ and the voltage $U_t$ at the terminals of the device. Alternatively, other measurements may be collected, in particular the temperature Ti. The measurements are time-stamped. This means that they can then be processed according to when they were measured. In particular, data of different types having the same date can together form an n-tuple, where n is the number of data items per time t.

The collected data are acquired during a period of uninterrupted operational functioning of the device. Thus, each type of data takes the form of a time series, here of the voltage and current of the device during operational functioning. Operational functioning is understood here as distinguished from a maintenance or test phase in which the operating conditions can be chosen to correspond to test conditions. On the contrary, during operational functioning the device follows the usual operating conditions, not conditions imposed specifically for the measurements.

It is preferable that each collected time series be usable. Also, the collection operation 101 may comprise or be preceded by a selection, or filtering, eliminating from the collection the time series including an unusable time interval, for example in the event of a missing value, an error message, misalignment of measurements, etc. At the end of the selection, the collected time series are all continuous and usable.

Figure 2:
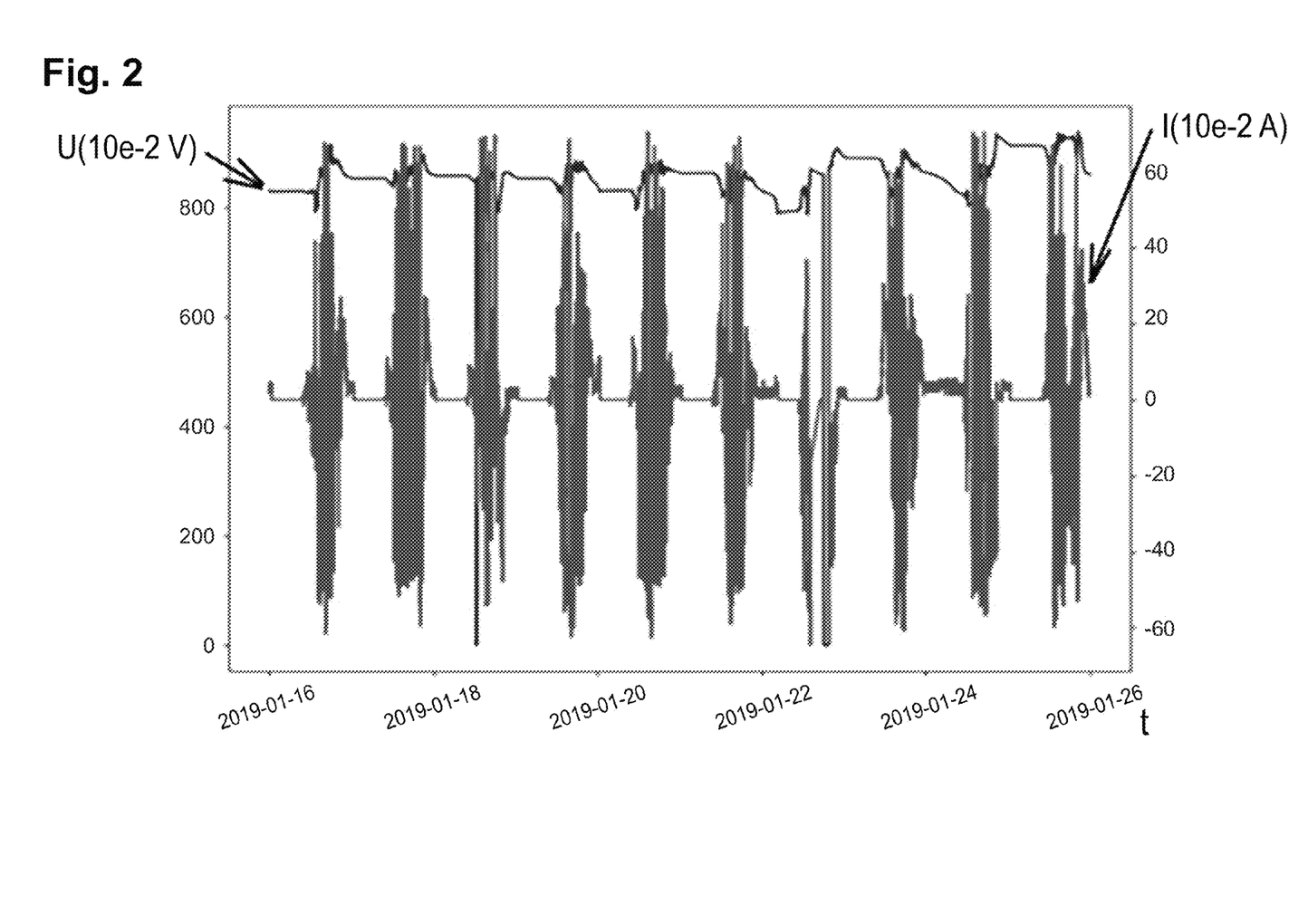
FIG. 2 shows a graph representative of time series used as input data to one embodiment of a method.

[FIG. 2] shows an example of a time series that can be used as input data. The voltage is indicated on the y-axis on the left and corresponds to the curve generally located in the upper part, while the current is indicated on the y-axis on the right and corresponds to the curve with large variations.

During an operation 102, a corrected current intensity $I_{cor,t}$ is calculated from the data collected at the end of operation 101 and for a plurality of times t. The calculation of the corrected current intensity $I_{cor,t}$ is carried out by applying a correction function to the measured current intensity $I_t$. In the following, the correction function is denoted a (alpha). The parameters of the correction function a may include the temperature T, the charge Q, and/or the voltage U.

The application of a correction function a is explained by electrochemical losses: the charge added to the device during charging is never completely released during discharge. This imbalance can lead to drift in the calculation of the instantaneous state of charge Q when there is no correction.

During an operation 103, coulomb counting is performed. An instantaneous charge $Q_t$ is calculated from the time series of the corrected current intensity $I_{cor}$. The instantaneous charge $Q_t$ is calculated for a plurality of times t.

The instantaneous charge $Q_t$ is calculated by an integral calculation according to the following formula:

$$Q(t)=Q(t=t_0)+\int_{t_0}^{t} I_{corr}(\tau)d\tau \qquad \text{[Math. 3]}$$

In the case where the initial charge $Q(t=t_0)$ is unknown, a relative charge level compared to the initial charge is sufficient. When the integral calculation is implemented in an algorithm, it can be in finite form.

At the end of operation 103, each time t (or time interval) is associated with a current intensity $I_t$, a corrected current intensity $I_{corr,t}$, a charge level $Q_t$, and a voltage $U_t$.

Thus, for each time t, a set of collected and calculated data $I_t$, $U_t$, $I_{cor,t}$, $Q_t$ is obtained.

Figure 3:
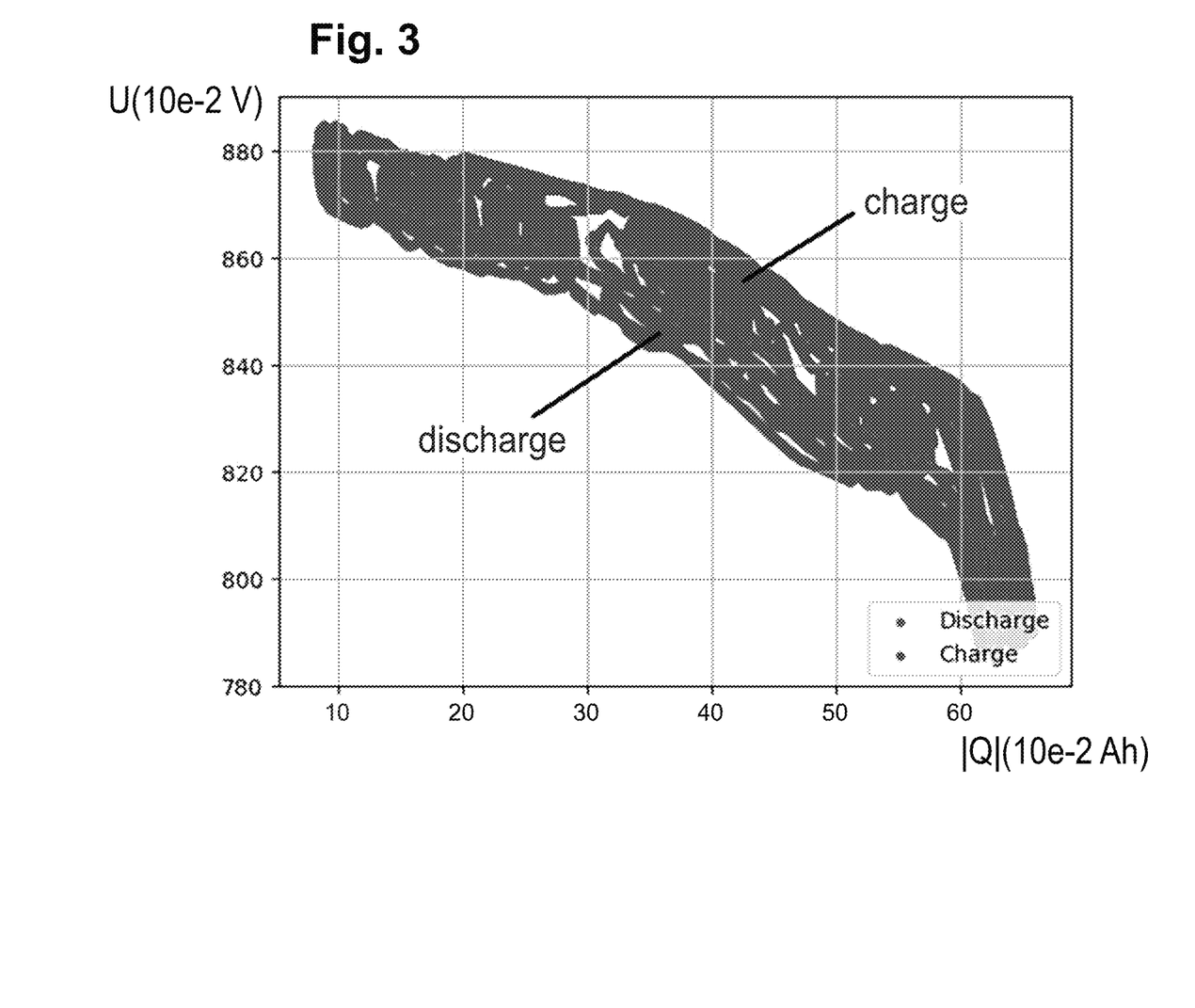
FIG. 3 shows a graph representative of a coulomb count during charges and discharges.

[FIG. 3] represents a coulomb count in a graph showing the cumulative charge Q (in ampere-hours) on the y-axis and the voltage (in volts) on the x-axis. The upper part of the curve corresponds to charging phases while the lower part of the curve corresponds to discharging phases.

In an operation 104, the data sets are grouped by ranges of instantaneous charge values $Q_t$ as a function of said charge value of each set. In other words, and unlike known methods, the data are not grouped temporally by successive periods of time, but by instantaneous charge values, here independently of their time stamp.

For example, charge ranges (or "tiers") are determined and define the groups. In the following example in equation form, the groups are defined by charge value ranges centered around one reference charge value per group. A charge group j groups for example the time intervals i according to the following formula:

$$j=\{(I_i,I_{corr,i},Q_i,U_i) \text{ such that } |Q_{ref}-Q_i|<\Delta Q\} \quad \text{[Math. 4]}$$

In the example above, the groups are all defined with a similar charge amplitude (2*$\Delta Q$). Alternatively, the amplitudes may be heterogeneous between groups.

During operation of the device, a succession of states may be reached. The device may therefore be in two similar states at several moments without these moments being successive. As the state of charge can be considered in a first approximation as characterizing the state of the device, all the times (or time intervals) having a similar charge Q can therefore be considered as corresponding to similar electrochemical states.

Figure 4:
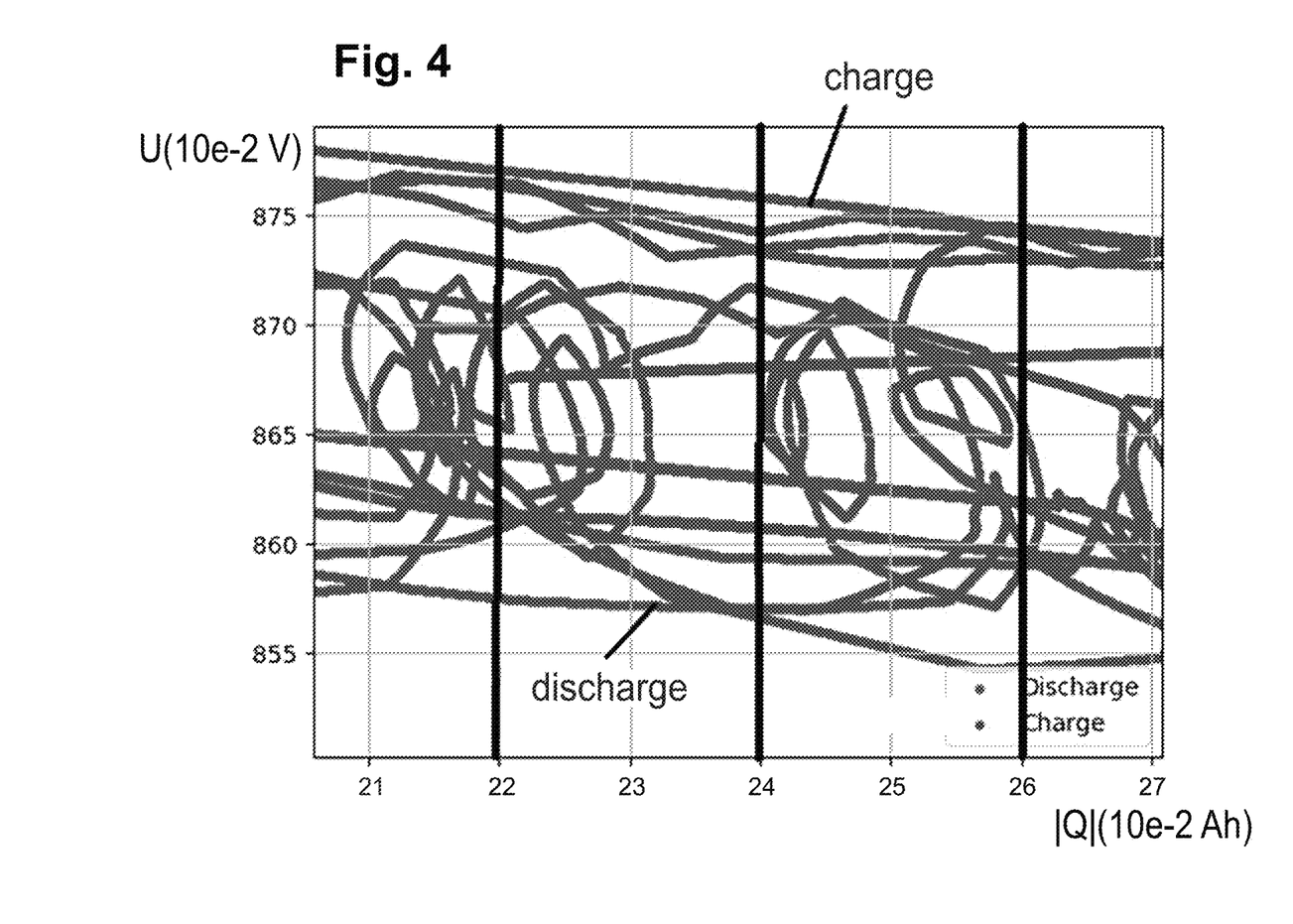
FIG. 4 represents a step of grouping into charge/discharge "tiers" of one embodiment.

[FIG. 4] shows details of the curve of [FIG. 3] in which the "subdivision" into charge groups is represented by vertical segments.

During an operation 105, an open circuit voltage of the device is calculated for each group separately (or tier by tier).

Many models allow estimating the open circuit voltage (or OCV) based on time series of current and voltage. The known methods are applied by time intervals or over a consecutive set of time intervals. Here, the estimation is carried out over a set of distinct and potentially distanced time intervals. For example, an equivalent first-order electric model can be used according to the following equation.

$$U(t)=V_{oc}(t)+R*I(t) \quad \text{[Math. 5]}$$

Here, the concept of time disappears, to be replaced by the concept of state of charge. The conventional calculation by time intervals is replaced by a calculation by charge range or group or by tier. The open circuit voltage (denoted $V_{oc}$ in the equation) is calculated by applying a deviation minimization function with a model. Taking an example of a least-squares minimization, the estimated open circuit voltage for a group satisfies the following formula:

$$(Voc, R) \text{ such that } \sum_i (U_i - Voc - RI_i)^2 = \text{[Math. 6]}$$

$$\min\left(\sum_i (U_i - a - bI_i)^2\right) = \Delta$$

The minimum A, also called the residual, of the least-squares function is representative of the robustness of the ($V_{oc}$, R) pair obtained. $I_t$ can be used to adjust the correction function a as will be described in more detail below.

At the end of the open circuit voltage calculations for each of the groups, we have a set of ($Q_{ref}$, $V_{oc}$) pairs, in other words an estimate of the characteristic curve of the open circuit voltage OCV.

An optional operation 106 may be implemented. Operation 106 comprises the graphical representation of the pairs ($Q_{ref}$, $V_{oc}$). [FIG. 6] is an example of such a representation: an open circuit voltage curve for the device.

Operations 101 to 106 described above can be viewed as forming a first set. This first set can be summarized by the following pseudocode:

```
Identification of continuous periods
While the error is unsatisfactory:
For each continuous period:
    While the error is unsatisfactory:
        Update the correction function
        Apply the correction function to the current
        Coulomb counting
        Subdivide into tiers of similar state of charge
        For each tier:
            Minimization calculation
            Obtain V_OC (and other parameters of interest)
        Check the error
    Obtain the OCV curve (and other parameters of interest) for this period
Obtain the OCV curve (and other parameters of interest) for each of the identified periods.
```

The first set of operations 101 to 106 makes it possible to have a plausible estimate of the state of the device because it is based on the following postulates:

The electrochemical state of an electrochemical element can, in the first order, be characterized by its open circuit voltage, which itself is solely a function of the charge Q contained in the element. All other things being equal, to each charge level Q there corresponds a unique open circuit voltage and vice versa (bijection).

$I_t$ is possible to estimate the open circuit voltage from the total voltage U and from the current intensity I by the use of mathematical, electrochemical, and/or electrical models.

The data measured during operation give access to the total on-load voltage U at the terminals of the device and to the current intensity I passing through it. By an integral calculation, it is possible to transform the evolution of the current intensity I passing through the device into the evolution of its charge level Q. Thus, for each time interval, it is possible to obtain at least the triplets I, Q, U. To each charge level Q there corresponds a single open circuit voltage $V_{oc}$. Furthermore, a relation between I, U, and $V_{oc}$ is known. From triplets (1, Q, U) such that the Qs are close, it is possible to identify a unique value of $V_{oc}$ satisfying pre-established precision conditions.

The operations which will now be described also make it possible to estimate, from the OCV curves obtained above, the state of health SOH of the device.

During an operation 108, a state of health of the device is calculated according to the following formula:

$$SOH = \frac{Q_{1 \to 2, ag\acute{e}}}{Q_{1 \to 2, init}} \quad \text{[Math. 7]}$$

$Q_{1 \to 2, age}$ corresponds to the difference in charge Q between two data sets corresponding to two open circuit voltages $COV_1$ and $COV_2$. $Q_{1 \to 2, init}$ corresponds to the difference in charge Q between the two data sets corresponding to the two open circuit voltages $COV_1$ and $COV_2$ in an initial state of the device for which the state of health is considered to be maximal.

Figure 5:
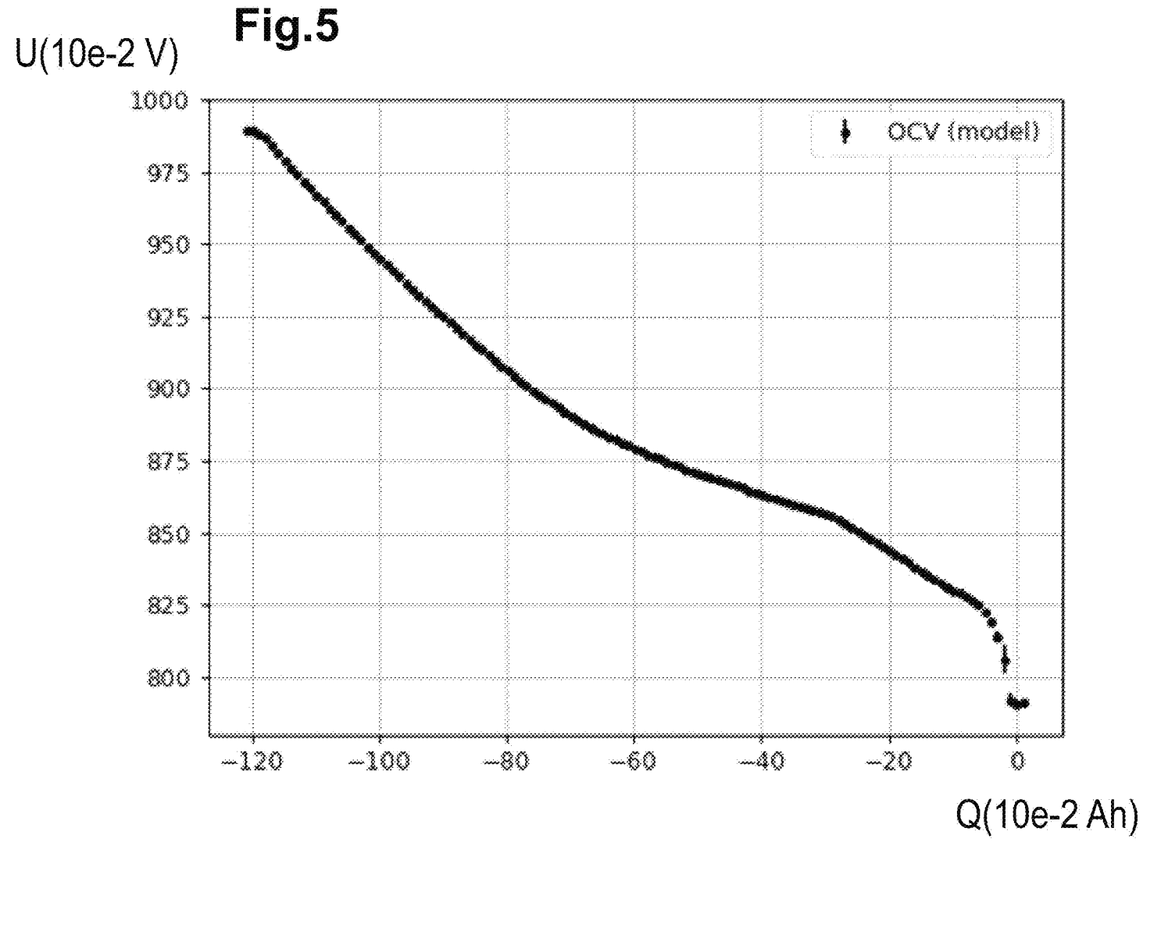
FIG. 5 shows an example of the obtained open circuit voltage curve.

The state of health quantifies the loss of capacity of the device compared to its initial capacity (new, not degraded). As a first approximation and from a geometric point of view, the reduction in capacity causes compression of the characteristic curve along the x-axis (see [FIG. 5]). In other words, between two open circuit voltage levels $V_{oc,1}$ and $V_{oc,2}$, aging of the device results in a decrease in the exchanged charge $Q_{1 \to 2}$. This explains why, in order to obtain an estimate of the state of health, knowing two levels of open circuit voltage $V_{oc,1}$ and $V_{oc,2}$ makes it possible to deduce the charge difference of the device in its initial state and the charge difference of the device between these same two levels in the degraded state which we wish to quantify.

The charge difference between two states can be calculated by a direct coulomb counting operation 107 based on time series, provided that the voltages do indeed correspond to open circuit voltages, in other word without load and after a sufficiently long rest period. The combination with the first set of operations therefore advantageously makes it possible to directly read an open circuit voltage characteristic without it being necessary to impose rest phases and therefore without it being necessary to interrupt the operational functioning of the device. In other words, the first set of operations allows doing without operation 107 to implement operation 108. However, operation 107 may also be implemented in addition to the first set of operations 101 to 106.

In operations 109 and 110, alternatives to operations 107 and 108, it is assumed that other open circuit voltage curves are available (or data which allows obtaining them indirectly). Such curves may result from conventional tests other than the first set of operations 101 to 106. For example, they are obtained beforehand by accelerated aging tests, state of health measurements in the field, etc. In such a situation, the state of health of the device currently being analyzed can be deduced by a correspondence between at least one available open circuit voltage curve and the open circuit voltage curve obtained at the end of the first set of operations 101 to 106. In other words, the open circuit voltage curve obtained is compared to a preexisting table of corresponding curves.

In an operation 109, the open circuit voltages obtained from the first set of operations 101 to 106 are subjected to an incremental capacity analysis (or ICA). Briefly, if g is a function such that $Q=g(V_{oc})$, then the ICA is an analysis of the derivative of the g function. A curve with characteristic patterns is thus obtained.

Figure 6:
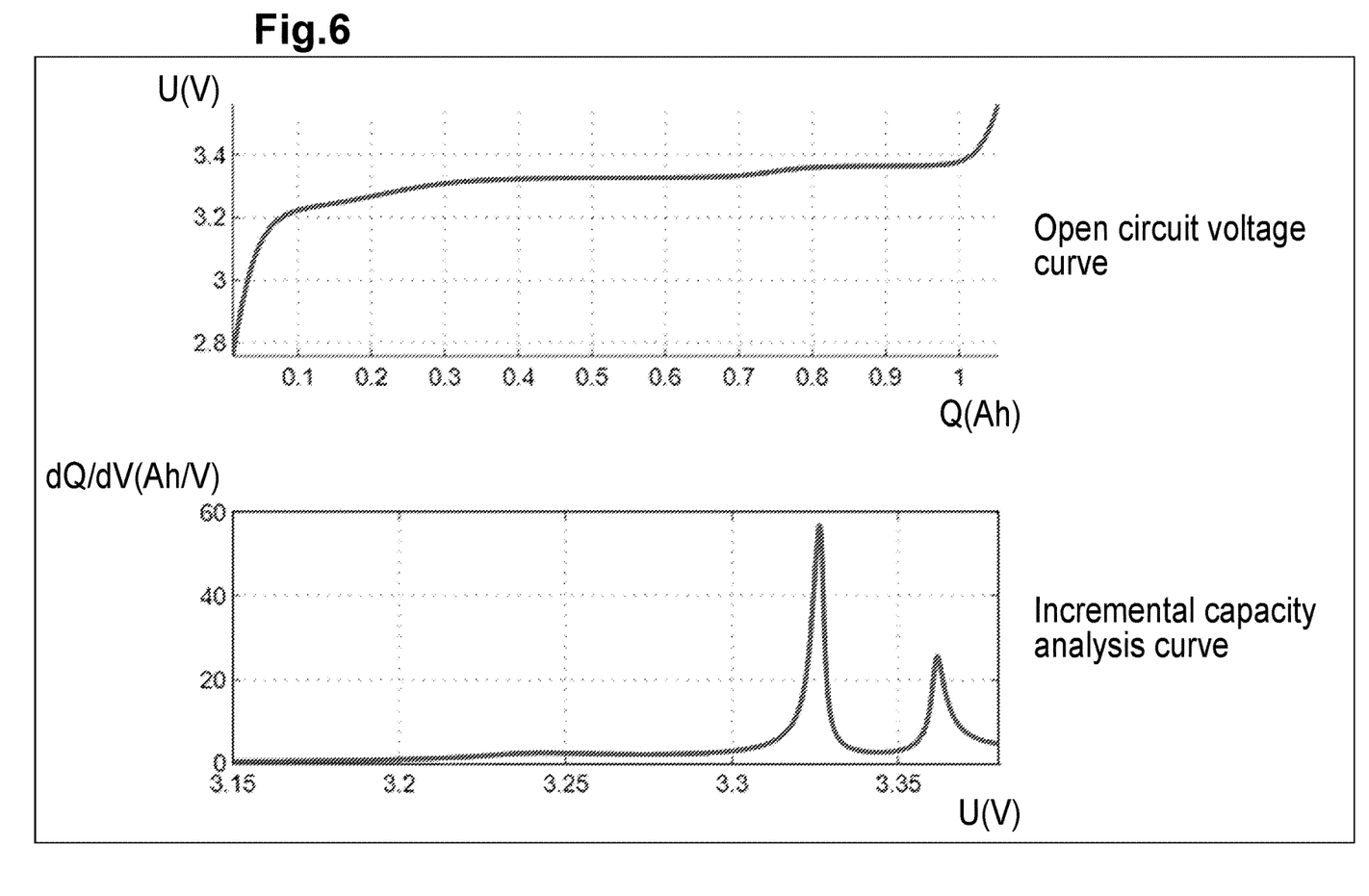
FIG. 6 shows an example of a step of an embodiment involving independent component analysis (ICA).

Here, the correspondence is based on an analysis of the derivative of the open circuit voltage curve, rather than on an analysis of the charge exchanged between two states characterized by their open circuit voltages (i.e. examining the average slope of the open circuit voltage curve between these voltages). [FIG. 6] graphically represents this operation. The upper part represents an open circuit voltage curve while the lower part represents a corresponding ICA curve.

Various ICA methods are known per se. In the example described here, to estimate the state of health, preference is given to analyzing the evolution of the characteristic patterns of the ICA curve as the device degrades (appearance, disappearance, displacement of peaks, valleys, areas, etc.). Quantifying the state of health from these patterns, and their evolution in particular, requires a prior series of preliminary tests to establish a correspondence between the patterns and the level of health.

Then, in an operation 110, the obtained curve (the derivative) is compared to reference curves corresponding to various states of health in order to identify the corresponding state of health.

In many cases, the open circuit voltage curve obtained from the first set of operations 101-106 is noisy. Indeed, the estimation of the $V_{oc}$ group by group (or tier by tier) yields a noisy OCV curve. Also, prior to applying the ICA, an intermediate post-processing step of the open circuit voltage curve is preferable. For example, smoothing and/or filtering is recommended.

The first set of operations 101-106 (or 101-105) may be implemented iteratively. For example, it may be implemented substantially in real time when the measurements for each instant are available in real time. In addition, the iterative implementation allows refining the precision, for example by simultaneously calculating the error and repeating the first set of operations when the error remains above a predefined threshold.

In addition, in parallel with the operation 102 of applying the correction function a, an operation 111 may be implemented, for example in real time.

Operation 111, which can also be viewed as part of operation 102, comprises the calculation of a state of charge (SOC) according to the following formula:

$$SOC_i = SOC_{i-1} + \frac{\int_{i-1}^{i} \alpha(I_i) dt}{Q_{max,i}} = SOC_{i-1} + \frac{\int_{i-1}^{i} I_{corr} dt}{Q_{max,i}} \quad \text{[Math. 8]}$$

The index i represents the iteration, and a the correction function.

Thus, operation 111 corresponds to application of the correction function for the current in order to calculate the SOC in real time. If the current flowing through the device under study is used directly as input data (without correction), a drift in the coulomb count appears. For example, a device with an electrical charge efficiency of 98% means that, over a complete charge-discharge cycle, only 98% of the electrical charge is discharged. A direct coulomb count (without correction) would then indicate a SOC of 2% at the end of the discharge although this element would be completely discharged, which is obviously incorrect.

The correction function, adjusted during operation 102, therefore renders the calculation of the device's SOC more reliable. The correction function a is updated with each execution of operation 111, therefore with each iteration. The cumulative calculation therefore is in accordance with formula [Math. 8] above.

As the formula shows, the coulomb count requires knowledge of an initial level in terms of SOC or Q. This reference may be established:
- based on times when the SOC is explicit, such as fully charged or fully discharged states of the device;
- in an intermediate state of charge, when the device has been at rest for a sufficient period of time. The measured voltage is then the open circuit voltage $V_{oc}$ and the SOC can be established from the OCV-Q map established at the end of the first set of operations 101-106.
- in an intermediate state of charge when the system is in operation, as described below in relation to operation 112.

In addition, these three options may also be used to recalibrate the coulomb count.

In parallel with the operation 105 for calculating the open circuit voltage by group, an operation 112 may be implemented, for example in real time.

Operation 112, which may also be viewed as part of operation 105, comprises a comparison of calculated open circuit voltages to curves of correspondence between open circuit voltages and state of charge (COV) in order to identify the corresponding state of charge.

Operation 112 makes use of the equivalent model calculated during the first set of operations 101 to 106, each of the component parameters of the equivalent model being known and adjusted to the current state of the device. Thus, measurements in current and voltage are translated into an open circuit voltage. In addition, upon completion of the first set of operations 101-106, an OCV-Q map is established.

There is therefore a linking correspondence between the voltage, the current, and the SOC. Thus, at each time t, $V_{oc}$ is calculated by means of the completely determined model and then converted into an SOC value by means of the OCV-Q map.

The methods and variants described above may be implemented by computer means, in particular a computer on which is stored a program for implementing such a method when the program is executed by a processor. Such a program may also be stored on a non-transitory computer-readable storage medium.

The proposed solutions allow an estimate of the state of health (SOH) and state of charge (SOC) of a device based on raw data during operation. First, the curve of the open circuit voltage (OCV) as a function of the charge (Q) is obtained by coulomb counting followed by an optimization calculation on an equivalent model.

The resulting curve $V_{oc}=f(Q)$ can then be used to determine the state of health of a device by coulomb counting between states or by a more generalized analysis of its shape. The real-time state of charge can be estimated by corrected coulomb counting or by evaluation of an equivalent model. The correction function, as well as the model, are intermediate results in the process of obtaining the OCV curve.

The present disclosure for calculating the SOH and SOC of a device during operation by means of estimating its OCV characteristic differs from known techniques in particular by:
- the use of state tiers as calculation windows. The state of the art only offers methods having a time window (one or more consecutive time intervals). This gives the advantage of exploiting the diversity of measurement points within a tier to obtain a more reliable result because it comes from a richer sample.
- the use of multiple non-consecutive states over time, a consequence of the previous point.
- a quantification of the uncertainty/error associated with the estimation of the characteristic OCV curve. This provides the dual advantage of judging the reliability of the result obtained and of serving as a verification variable.
- the use of a correction function for the current for all applications requiring coulomb counting. This gives the advantage of performing a more accurate coulomb count.
- the adjustment of the correction function by using the error of the OCV curve rather than other raw variables such as the voltage or the theoretical SOC supplied by the manufacturer, but not specific to the actual device considered.
- the application of equivalent models integrated in optimization/minimization functions, while the literature presents only equivalent models used in isolation.
- the non-use of the SOC variable supplied by the manufacturer for calculating the SOH. This gives the advantage of not depending on the reliability of this indicator.
- the possibility of dispensing with $V_{oc}$-SOC maps prior to using the battery since these are produced during the utilization phase. This gives the advantage of dispensing with expensive series of tests.

Consequently, the proposed solutions generally allow:
- removing the constraint of specific stress profiles. Many known methods provide an estimate of the state of health based on current and voltage data. However, they require specific stress profiles (full cycle, profile with rest periods, current and voltage limits, etc.). They cannot be applied based on data from any stress profile. The proposed solution is applicable to any type of profile.
- removing the constraint of algorithmic calculations that are cumbersome and costly in terms of computing resources and time. The optimization calculation is linear and therefore inexpensive.
- removing the measurement continuity constraint for aging models. Unlike cumulative aging models which require continuous computation of degradation from a known degradation state, this solution can be deployed directly over a short period (hours, days) without knowing the system's history.
- providing access to laboratory techniques for estimating the SOH. Since the OCV curve is typically obtained under laboratory conditions, the first set of operations allows converting raw operational data into a form usable by laboratory techniques.
- providing an alternative to the SOC and SOH indicators calculated by the manufacturer.

One will note that the iterative loop between operations 106 and 102 which enables finding the best correction function for the current can be eliminated. The method can therefore be based on a predefined or evolving correction function.

Operation 104 may incorporate occurrence detection. An occurrence is defined here as a set of consecutive time intervals within a capacity group (or tier). During operation 105, these occurrences may undergo specific processing, for example be converted into an average or be filtered (absolute value of the current, its derivative, as a function of temperature, etc.).

Operation 105 may include models of a higher order than that described above, in other words showing temporal derivatives. The parameters related to the terms of temporal derivatives may be calculated or imposed.

The method may or may not include the measurement of the input data itself. There are two ways of implementing the method:

For real-time applications (storage that is stationary or onboard the device). The algorithmic method may be integrated into the management system of the device (or BMS for "Battery Management System"). The sufficient raw data then correspond to times $(t_0, t_0-\Delta t, \ldots, t_0-n*\Delta t)$. The first set of operations 101 to 106 may be performed continuously over a sliding window, or periodically. Calculation of the SOH may be done at each execution (iteration) of the first set. Calculation of the SOC may be done continuously, updating the parameters at each iteration of the first set. The method then uses the calculated indicators locally, or may export them.

For a posteriori analysis applications (energy storage that is stationary or onboard). The algorithmic method may be remote from the device itself, for example integrated into a more general data processing tool in which some or all of the collected data are processed.

Depending on the applications, the results obtained may be classified as final or intermediate results. At least partial estimation of the OCV curve after each execution of the first set of operations 101-106 may generally be considered a final result. The same is true for an estimate of the SOH after each iteration followed by steps 107, 108, 109 and/or 110, as well as for an estimate of the SOC at each time interval. An adjusted current correction function for the coulomb counting as well as an estimate of internal resistance and other component parameters of the equivalent model for each charge group (or tier) can be considered intermediate results.

In both cases, the SOH and SOC values, as well as the OCV curves obtained, can be compared to the results calculated by known methods and implemented in the Battery Management System (BMS) and to the values measured during tests.

The redundancy in the calculation of the methods described here makes it possible to obtain more precise indicators and therefore to perform a more reliable control of electrochemical devices for energy storage. The overall reliability of the systems is improved. Their lifespan can be increased by a more suitable control.

The indicators are estimated without changing the behavior of the device. The service value of the device is therefore not impacted by such methods. No additional tools or equipment are necessary (probes, sensors). Only basic physical quantities such as voltage, current, and temperature are used. These properties are usually measured and available in existing systems.

Finally, no series of tests is required beforehand (to assess the aging of the system by extensively testing certain samples). No series of tests is required downstream of the utilization phase (post mortem analyses).

The present disclosure is not limited to the exemplary methods, programs, and storage media described above solely by way of example, but encompasses all variants conceivable to the skilled person within the scope of the protection sought.

LIST OF REFERENCE NUMBERS

101 to 112: Operation

The invention claimed is:

1. A method for determining an open circuit voltage of an electrochemical device to manage said electrochemical device, implemented by a computer, the method comprising:
collecting measurement data of the device, said measurements including at least a measured current intensity $I_t$ and a measured voltage $U_t$ at terminals of the device, the measurements being time-stamped and acquired during an uninterrupted and operational functional period of the device;
calculating, for a plurality of times t,
a corrected current intensity $I_{cor,t}$ by correcting the measured current intensity $I_t$, and
an instantaneous charge $Q_t$ based on a time series $I_{cor}$ of the corrected current intensity for the plurality of times,
to obtain, for each time t of the plurality of times t, a set of collected and calculated data $I_t$, $U_t$, $I_{cor,t}$, and $Q_t$;
grouping the data sets into ranges of instantaneous charge values based on said charge value of each of the sets;
separately for each of the groups, calculating an open circuit voltage of the device by applying a deviation minimization function on each of the groups;
determining a state of health of the device, based on the calculated open circuit voltage calculated for each of the groups; and
managing the electrochemical device based on said state of health of the device.

2. The method according to claim 1, further comprising, after calculating the open circuit voltages:
calculating the state of health of the device according to the following formula:

$$SOH = \frac{Q_{1 \to 2, age}}{Q_{1 \to 2, init}}$$

where $Q_{1 \to 2, age}$ corresponds to the charge difference Q between two data sets corresponding to two open circuit voltages, and
$Q_{1 \to 2, init}$ corresponds to the charge difference Q between the two data sets corresponding to the two open circuit voltages in an initial state of the device for which the state of health is considered to be maximal.

3. The method according to claim 2, further comprising, after calculating the open circuit voltages:
subjecting the calculated open circuit voltages to an incremental capacity analysis to obtain a curve of characteristic patterns; and
comparing the obtained curve to reference curves corresponding to various states of health in order to identify the corresponding state of health.

4. The method according to claim 2, wherein the calculating is carried out iteratively at each of the times t, and
wherein the instantaneous charge $Q_t$ is calculated based on a time series of the corrected current intensity $I_{cor,t}$ according to the following formula:

$$Q(t) = Q(t=t_0) + \int_{t_0}^{t} I_{corr}(\tau) d\tau$$

where Q(t=t$_0$) is a charge level relative to the initial charge level.

5. The method according to claim 2, further comprising, after calculating the open circuit voltages:
comparing the calculated open circuit voltages to curves of correspondence between open circuit voltages and a state of charge in order to identify the corresponding state of charge.

6. A non-transitory computer-readable storage medium on which is stored a program for implementing the method according to claim 2 when the program is executed by a processor.

7. The method according to claim 1, further comprising, after calculating the open circuit voltages:
subjecting the calculated open circuit voltages to an incremental capacity analysis to obtain a curve of characteristic patterns; and
comparing the obtained curve to reference curves corresponding to various states of health in order to identify the corresponding state of health.

8. The method according to claim 7, wherein the calculating is carried out iteratively at each of the times t, and
wherein the instantaneous charge Q$_t$ is calculated based on a time series of the corrected current intensity I$_{cor,t}$ according to the following formula:

$$Q(t)=Q(t=t_0)+\int_{t_0}^{t} I_{corr}(\tau)d\tau$$

where Q(t=t$_0$) is a charge level relative to the initial charge level.

9. The method according to claim 7, further comprising, after calculating the open circuit voltages:
comparing the calculated open circuit voltages to curves of correspondence between open circuit voltages and a state of charge in order to identify the corresponding state of charge.

10. A non-transitory computer-readable storage medium on which is stored a program for implementing the method according to claim 7 the program is executed by a processor.

11. The method according to claim 1, wherein the calculating is carried out iteratively at each of the times t, and
wherein the instantaneous charge Q$_t$ is calculated based on a time series of the corrected current intensity I$_{cor,t}$ according to the following formula:

$$Q(t)=Q(t=t_0)+\int_{t_0}^{t} I_{corr}(\tau)d\tau$$

where Q(t=t$_0$) is a charge level relative to the initial charge level.

12. The method according to claim 11, wherein the calculating further comprises:
calculating a state of charge according to the following formula:

$$SOC_i - SOC_{i-1} + \frac{\int_{i-1}^{i} \alpha(I_i)dt}{Q_{max,i}} - SOC_{i-1} + \frac{\int_{i-1}^{i} I_{corr}dt}{Q_{max,i}}$$

where the index i represents the iteration and $\alpha$ represents a correction function.

13. A non-transitory computer-readable storage medium on which is stored a program for implementing the method according to claim 12 the program is executed by a processor.

14. The method according to claim 11, further comprising, after calculating the open circuit voltages:
comparing the calculated open circuit voltages to curves of correspondence between open circuit voltages and a state of charge in order to identify the corresponding state of charge.

15. A non-transitory computer-readable storage medium on which is stored a program for implementing the method according to claim 11 the program is executed by a processor.

16. The method according to claim 1, further comprising, after calculating the open circuit voltages:
comparing the calculated open circuit voltages to curves of correspondence between open circuit voltages and a state of charge in order to identify the corresponding state of charge.

17. The method according to claim 1, further comprising, after calculating the open circuit voltages, calculating the state of health of the device by at least one of the following operations:
comparing the obtained open circuit voltages to open circuit voltages obtained by a plurality of laboratory aging tests on said device,
comparing the obtained open circuit voltages to open circuit voltages obtained by a plurality of laboratory aging tests on a device of a model similar to said device, and
comparing the obtained open circuit voltages to open circuit voltages obtained by a previous implementation of the method on said device.

18. A computer program product embodied on a non-transitory computer-readable medium, the computer program product comprising instructions for implementing the method according to claim 1 when this program is executed by a processor.

19. A non-transitory computer-readable storage medium on which is stored a program for implementing the method according to claim 1 when the program is executed by a processor.

* * * * *